(12) United States Patent
Razavi et al.

(10) Patent No.: US 6,807,406 B1
(45) Date of Patent: Oct. 19, 2004

(54) VARIABLE GAIN MIXER CIRCUIT

(75) Inventors: Behzad Razavi, Los Angeles, CA (US); Pengfei Zhang, Fremont, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 300 days.

(21) Appl. No.: 09/690,937

(22) Filed: Oct. 17, 2000

(51) Int. Cl.[7] ............................ H04B 1/26; H04B 15/00
(52) U.S. Cl. .................... 455/313; 455/139; 455/182.1; 455/232.1; 455/234.1; 375/344; 375/345
(58) Field of Search ................................. 455/313, 326, 455/130, 139, 182, 192, 196.1, 232.1, 234.1, 239.1; 375/219, 316, 344, 345, 349; 327/147, 359

(56) References Cited

U.S. PATENT DOCUMENTS

| | | | | |
|---|---|---|---|---|
| 4,313,212 A | * | 1/1982 | Whitlock | 455/146 |
| 4,591,826 A | * | 5/1986 | Seiler | 341/154 |
| 4,612,585 A | | 9/1986 | Takase et al. | 358/316 |
| 4,736,390 A | * | 4/1988 | Ward et al. | 375/316 |
| 4,766,497 A | | 8/1988 | Banach et al. | 358/188 |
| 4,953,182 A | * | 8/1990 | Chung | 375/344 |
| 4,955,078 A | * | 9/1990 | Chung | 455/244.1 |
| 5,265,005 A | * | 11/1993 | Schmidt et al. | 700/18 |
| 5,589,791 A | * | 12/1996 | Gilbert | 327/359 |
| 5,633,779 A | * | 5/1997 | Knoble et al. | 361/187 |
| 5,635,892 A | | 6/1997 | Ashby et al. | 336/200 |
| 5,736,749 A | | 4/1998 | Xie | 257/3 |
| 5,745,838 A | | 4/1998 | Tresness et al. | 455/5.1 |
| 5,748,466 A | * | 5/1998 | McGivern et al. | 417/44.9 |
| 5,939,911 A | * | 8/1999 | Humphreys et al. | 327/147 |
| 5,987,075 A | * | 11/1999 | Abe et al. | 375/334 |
| 6,008,102 A | | 12/1999 | Alford et al. | 438/381 |
| 6,031,432 A | | 2/2000 | Schreuders | 333/24 R |
| 6,304,656 B1 | * | 10/2001 | Mou et al. | 379/413.01 |
| 6,307,879 B1 | * | 10/2001 | Moriyama | 375/219 |
| 6,317,589 B1 | * | 11/2001 | Nash | 455/245.2 |

OTHER PUBLICATIONS

Liu T. and Westerwick, E., "5–GHz CMOS Radio Transceiver Front–End Chipset", *IEEE Journal of Solid–State Circuits*, vol. 35, No. 12, Dec. 2000, pp. 1927–1941.

(List continued on next page.)

Primary Examiner—William Trost
Assistant Examiner—Stephen D'Agosta
(74) Attorney, Agent, or Firm—Withrow & Terranova, PLLC

(57) ABSTRACT

In accordance with embodiments of the present invention, a receiver system is provided with a variable gain mixer circuit that is advantageous over current architectures used in wireless communication systems. The use of a variable gain mixer circuit simplifies the receiver architecture resulting in the elimination of additional circuit blocks and a reduction in complexity and cost. Moreover, one embodiment of the present invention includes a mixer circuit comprising a mixer core, a bias circuit coupled to the mixer core for providing a bias current, and a variable impedance network. The mixer core receives input signals and generates output currents that are coupled to the variable impedance network. Each of the output currents are selectively coupled to a voltage output node through a variable impedance. Variable gain is established by varying the impedance between the output currents of the mixer core and the voltage output node.

28 Claims, 10 Drawing Sheets

OTHER PUBLICATIONS

Steyaert et al., "A 2–V CMOS Cellular Transceiver Front–End", *IEEE Journal of Solid–State Circuits*, vol. 35, No. 12, Dec. 2000, pp. 1895–1907.

Lam, C. and Razavi, B., "A 2.6–GHz/5.2–GHz Frequency Synthesizer in 0.4–μm CMOS Technology", *IEEE Journal of Solid–State Circuits*, vol. 35, No. 5, May 2000, pp. 788–794.

Rategh et al., "A CMOS Frequency Synthesizer with an Injection–Locked Frequency Divider for a 5–GHz Wireless LAN Receiver", *IEEE Journal of Solid–State Circuits*, vol. 35, No. 5, May 2000, pp. 780–787.

Samavati et al., "A 5–GHz CMOS Wireless LAN Receiver Front End", *IEEE Journal of Solid–State Circuits*, vol. 35, No. 5, May 2000, pp. 765–772.

Wong et al., "A Wide Turning Range Gated Varactor", *IEEE Journal of Solid–State Circuits*, vol. 35, No. 5, May 2000, pp. 773–779.

* cited by examiner

VARIABLE GAIN MIXER CIRCUIT

BACKGROUND OF THE INVENTION

The present invention relates to electronic systems and circuits for use in wireless receivers and transmitters, and more particularly, to an electronic system having a mixer circuit with variable gain.

The field of wireless technology is currently undergoing a revolution, and is experiencing exponential growth. Cell phones, once considered a novelty and referred to as "car phones" are now ubiquitous, and cordless phones in the home are commonplace. A whole new batch of wireless personal digital assistants, and Bluetooth enabled computer peripherals are now entering the market, with wireless internet access as a driving force. A mixer having a variable gain is described which facilitates the design and lower the cost of circuits for these and other related products.

Wireless devices typically transmit and receive data through the air on high frequency electromagnetic waveforms, though some systems, such as satellite dishes and pagers simply receive, and others merely transmit. Data transmission is begun by encoding the data to be transmitted. This encoded data typically has a data rate of 100 kHz to 100 MHz and modulates a high frequency carrier signal. The carrier signal is often in the 2–10 GHz range. The modulated carrier signal is then applied to an antenna for broadcasting. The broadcast signal is referred to as a radio frequency (RF) signal. Reception involves receiving the RF signal on a different antenna, and filtering undesired spectral components. The signal is demodulated, filtered again, and decoded.

In real world situations, the amplitude of a received RF signal is constantly changing. For example, a passenger using a cell phone in a moving car may be traveling toward the antenna which is providing a signal. In that case, the amplitude of the received signal increases as the car approaches the antenna. Furthermore, buildings may intervene, or the car may enter a tunnel. These cause a received signal strength to decrease.

But receivers operate best if the amplitudes of received signals remain in a specific range. Specifically, if the signal power is too small, errors occur due to noise sources such as natural radiation, television and radio broadcasting, power transmission systems and the like. If the signal is too large, the linearity of the receive channel is lost and the signal begins to clip, again resulting in errors.

A conventional solution for this is to insert a variable gain amplifier in the receive channel. If the signal strength decreases, the amplifier gain is correspondingly increased. If received power increases, the gain may appropriately be lowered.

Conventional Receivers and Mixers

FIG. 1 is a block diagram of one such conventional receiver channel. Specifically, a direct conversion receiver is represented. It may also be referred to as a low IF (intermediate frequency), zero IF, or homodyne receiver. Included is a low noise amplifier (LNA) 110, a modulator or mixer 120, low pass filter (LPF) 130, variable gain amplifier (VGA) 140, analog to digital converter (A/D) 150, digital signal processor (DSP) 160, voltage controlled oscillator (VCO) 170, phase lock loop (PLL) 170, and digital to analog converter (D/A) 190. The PLL 160 includes a frequency synthesizer, phase-frequency detector, and loop filter.

The RF signal is received on an antenna (not shown) coupled to line 105. A choke filter may be used to remove unwanted spectral portions from received signal. The RF signal is amplified by LNA 110, and provided to the mixer 120. LNA 110 may be a composite of more than one amplifier, for example a second LNA may be on a chip with the other blocks shown, while a first LNA may be off-chip. A VCO 170 generates a local oscillator (LO) signal on line 175, and provides it to the mixer 120 and PLL 180. The VCO may be on-chip or off-chip; alternately it may have its transistors on-chip, with some passive components external.

The mixer 120 multiplies the RFin signal on line 115 with the LO signal on line 175. The mixer outputs a signal on line IF1 125, which has spectral components at the two frequencies which are the sum and difference of the RFin and LO signals. Specifically, if the RFin and LO frequencies are both 2.4 GHz, IF1 has components at DC (0 Hz) and 4.8 GHz.

LPF 130 filters the high frequency sum products of IF1 while passing the low frequency difference components. VGA 140 adjusts the amplitude of the signal at IF3 in order to optimize the use of the dynamic range of A/D 150. The A/D 150 converts the analog signal IF3 on line 145 into a digital waveform, and provides it on bus DOUT 155 to DSP 160. The DSP 160 decodes the data, and provides an output on line 165. PLL 180 generates the voltage which controls the VCO's oscillation frequency. The control voltage is Vtune, and is output from the PLL to the VCO on line 185. The PLL divides the LO signal on line 175 and compares that to a reference frequency (REF) provided on line 199. The LO frequency is adjusted accordingly.

DSP 160 provides a second output on bus Dgain 197. This signal is the result of a comparison of the amplitude of A/D output signal Dout on bus 155 with the range of available outputs from the A/D. The digital signal on Dgain bus 197 is converted to an analog signal used to control the gain of VGA 140. For example, one A/D may have 256 available output levels. If the signal at Dout 155 covers a range of only 30 levels, there is excessive quantization error. The gain of VGA 140 can be increased such that 200 levels are used. This increase in VGA gain results in a 4 times increase in the accuracy of the digitization of the waveform on IF3 145. But if all 256 available output levels are used, the signal may be clipping, and information may be lost. The gain of VGA 140 can be reduced, again to where 200 levels are used.

A conventional mixer circuit used in conventional receivers and/or transmitters is shown in FIG. 2. The mixer has a first input port 245 labeled RFin, a second differential input port for the LO signal on lines 215 and 225, and a differential output signal IF1 on lines 265 and 275. Voltage changes at RFin generate a current in capacitor C1 240. This current modulates the tail current provided by M3 230 under the control of the bias voltage on node 235. This RFin modulated current is then multiplied in the mixer core M1 210 and M2 220, resulting in the IF1 output at nodes 265 and 275. The output signal IF1 will have two frequency components, one at the sum of the frequency of the RFin and LO signals, and one at the difference.

In FIG. 1, several blocks are involved in mixing the signals and adjusting the output amplitude. Specifically, mixer 120 mixes the signals, VGA 140 controls the signal amplitude, and DSP 160, along with D/A 190 control the gain of VGA 140. Each block adds noise to the signal, and consumes both power and die area. Moreover, the variation of gain in a typical VGA is often non-linear. Therefore, it would be desirable to obtain a mixer circuit that allows for a simpler topology with reduced complexity. Additionally, it would be desirable to obtain a system wherein the variable gain is substantially linear.

SUMMARY OF THE INVENTION

In accordance with embodiments of the present invention a simplified architecture for a receiver system is provided. Additionally, embodiments of the present invention provide a variable gain mixer circuit useful in the simplified receiver system.

Accordingly, one embodiment of the present invention provides an apparatus including a receiver system, the receiver system comprising a first amplifier having an input coupled to receive an input RF signal and an output to produce an amplified RF signal, a variable gain mixer circuit having a first input, a second input to receive the amplified RF signal, a mixer output, and a control input, a low pass filter coupled to the mixer output, an analog-to-digital converter coupled to the low pass filter for producing a digital output signal, and a voltage controlled oscillator for producing an oscillator signal, the oscillator signal coupled to the first input of the variable gain mixer circuit. The digital output signal is coupled to the control input of the variable gain mixer circuit for varying the gain of the mixer circuit.

Another embodiment of the present invention includes a mixer circuit comprising a mixer core receiving first and second inputs and having a plurality of output currents, a bias circuit coupled to the mixer core for providing a bias current, and a variable impedance network coupled to the plurality of output currents, wherein each of the plurality of outputs current is selectively coupled to a corresponding voltage output node through a variable impedance.

In one embodiment, the present invention includes a mixer circuit comprising a differential input stage for receiving a differential input signal and generating first and second differential output currents, a bias circuit having a bias output coupled to the differential input stage, the bias circuit receiving a bias signal, and in accordance therewith, generating a bias current at the bias output, and first and second variable impedance networks having corresponding first and second current input nodes, the first current input node coupled to the first differential output current and the second current input node coupled to the second differential output current, each variable impedance network including a digital input for receiving a digital control signal and a voltage output node. Each current input node is selectively coupled to a plurality of network nodes in the corresponding variable impedance network in accordance with the digital control signal, and each network node having a unique impedance to the corresponding voltage output node.

In one embodiment, the present invention includes a mixer circuit comprising first and second transistors for receiving a pair of differential input signals, a third transistor for receiving a modulated RF signal and for setting the DC bias current in the mixer, and a variable impedance network having a first terminal coupled to the first supply voltage and a second terminal coupled to a first current output of at least one of the first and second transistors. The variable impedance network further comprises a plurality of network nodes, a plurality of series resistors coupled between each of the network nodes each having a resistance R, a plurality of shunt resistors coupled between the network nodes and the supply voltage each having a resistance of 2R, a terminal shunt resistor coupled between a terminal network node and the supply voltage, and a plurality of switches for coupling the first current output to at least one of the network nodes.

In another embodiment, the present invention includes a method of controlling the gain in a mixer circuit comprising receiving first and second signals in a mixer core, receiving a bias current in the mixer core, generating a plurality of current outputs from the mixer core in response to the first signal, the second signal, and the bias current, receiving the plurality of current outputs in a variable impedance network, and selectively coupling each of the plurality of current outputs to a corresponding voltage output node through a variable impedance.

The following detailed description and the accompanying drawings provide a better understanding of the nature and advantages of the present invention.

DESCRIPTION OF THE SPECIFIC EMBODIMENTS

Figure 3:
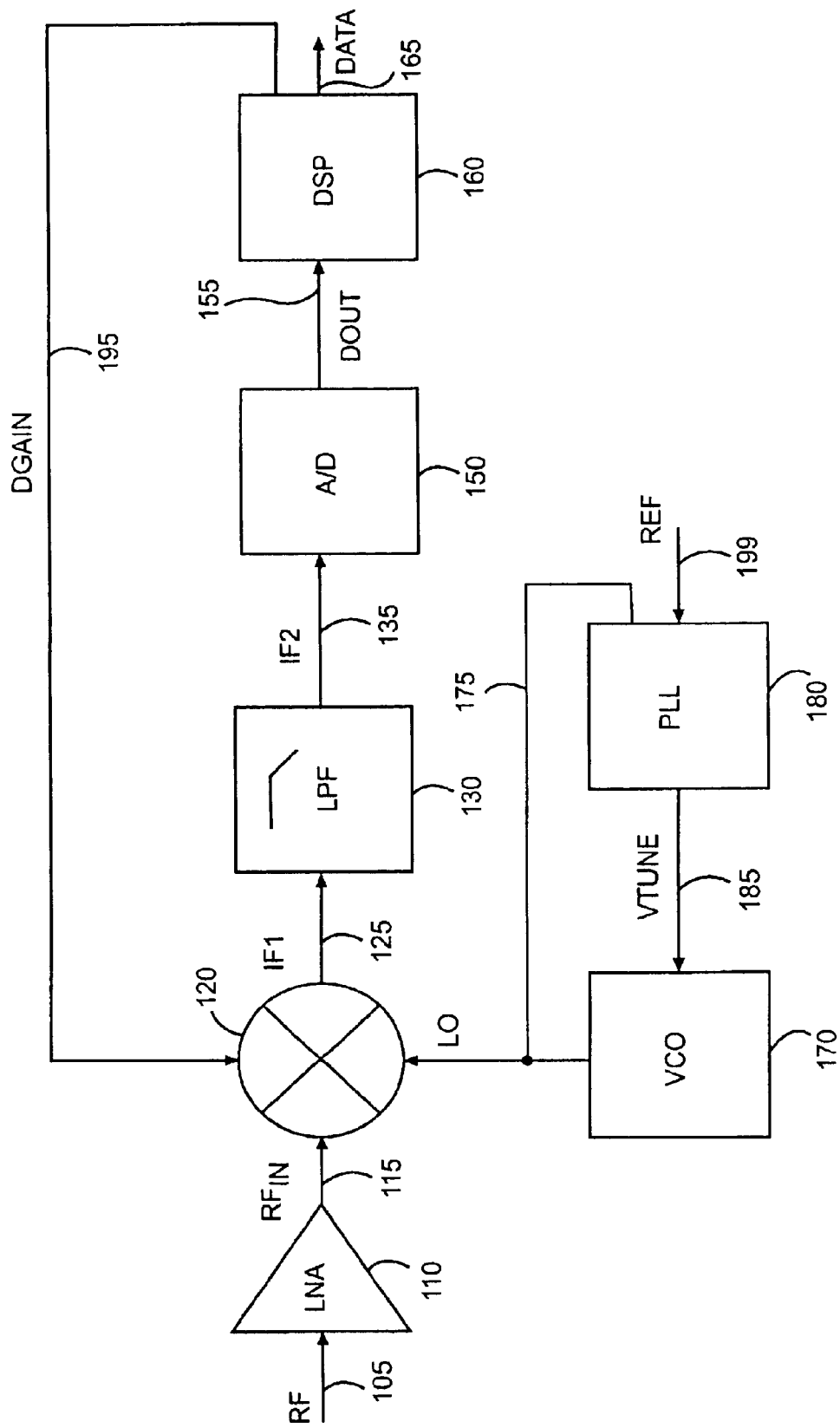
FIG. 3 is a block diagram illustrating a receive channel in accordance with one embodiment of the present invention.

FIG. 3 is a block diagram illustrating a receive channel 300 in accordance with one embodiment of the present invention. The receiver channel 300 incorporates a mixer circuit having a variable conversion gain. Having a variable gain mixer circuit eliminates the VGA 140 and D/A 190 in conventional receiver channels such as FIG. 1. The receiver 300 may be referred to as a direct conversion receiver, a low IF (intermediate frequency), zero IF, or homodyne receiver because the RF signal is being converted directly down to base band. It is to be understood, however, that the present invention applies to other receiver architectures that convert the input signal to one or more intermediate frequencies before the baseband. The receiver channel 300 includes a low noise amplifier (LNA) 110, a variable gain mixer circuit 120, a low pass filter (LPF) 130, an analog-to-digital converter (A/D) 150, a digital controller such as a digital signal processor (DSP) 160, voltage controlled oscillator (VCO) 170, and phase lock loop (PLL) 180. The PLL 180 includes a frequency synthesizer, phase-frequency detector, and loop filter.

Figure 1:
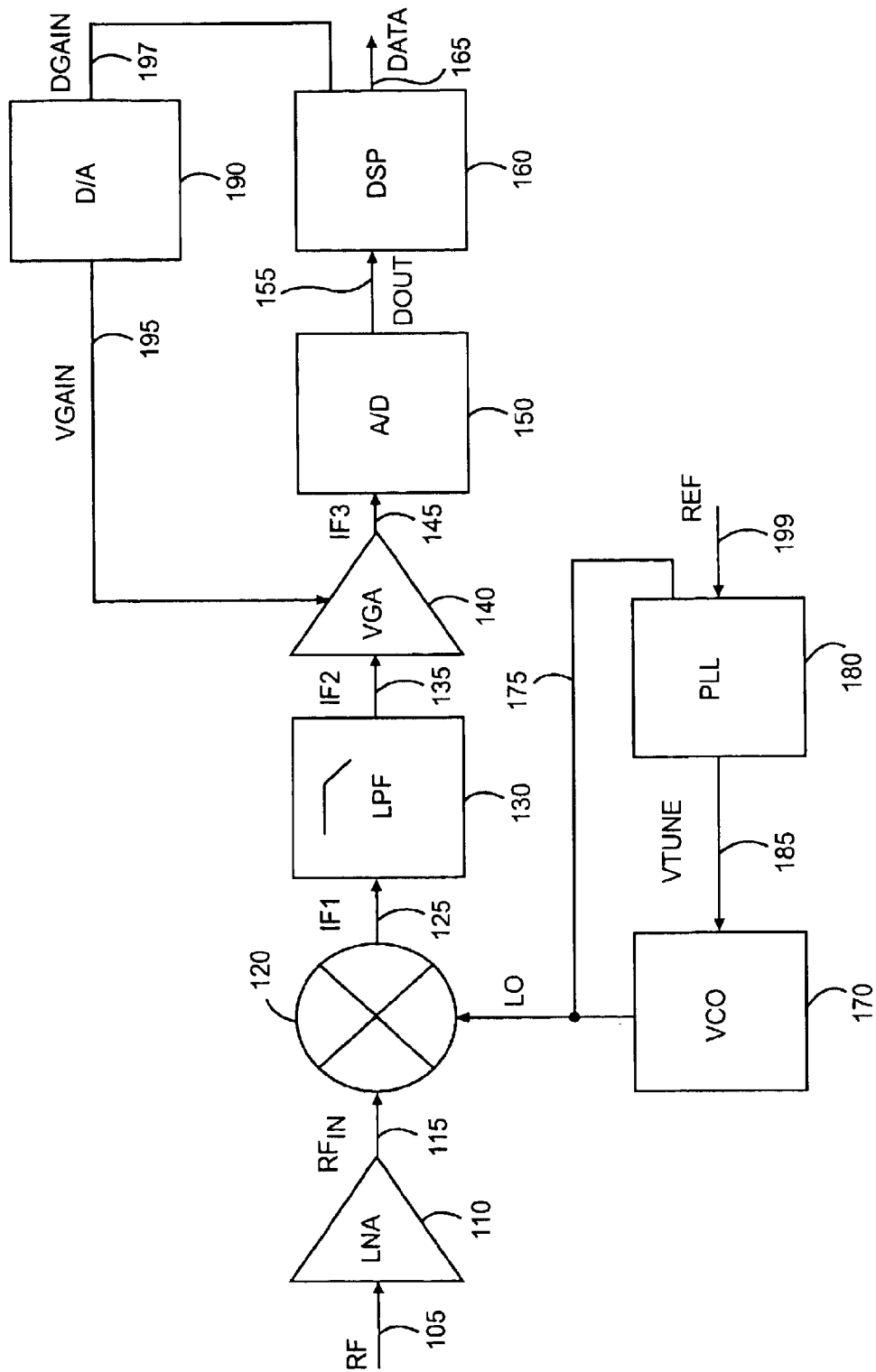
FIG. 1 illustrates a simplified architectural block diagram of a conventional receiver channel.
Figure 2:
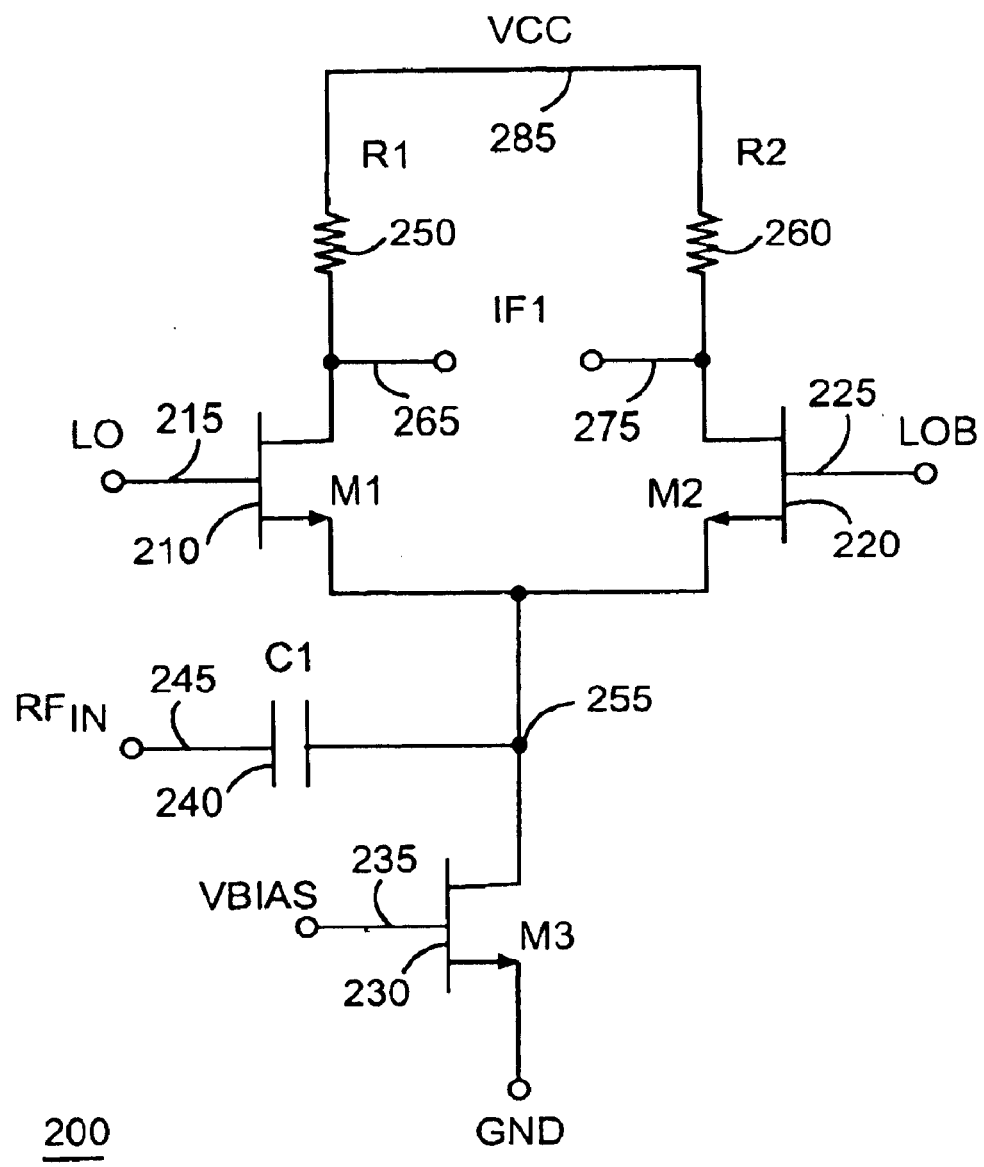
FIG. 2 illustrates a conventional mixer circuit used in a conventional receiver or transmitter.

As in FIG. 1, the RF signal is received on an antenna (not shown) coupled to line 105. A choke filter may be used to remove unwanted spectral portions of the received signal. The RF signal is amplified by LNA 110, and provided to the variable gain mixer circuit 120. It is to be understood that the LNA may be an integrated amplifier (i.e. integrated on the same chip) or a combination of an external amplifier, such as a low noise transistor amplifier, and an integrated buffer amplifier. The VCO provides an output oscillator signal LO 175 to the variable gain mixer circuit 120 and PLL 180. In one embodiment, the VCO output oscillator frequency may also be a differential signal LO and $\overline{LO}$. The oscillator signal frequency may be about equal to the RF-signal frequency. Alternately, the frequency may be less than, or more than, the RF signal frequency.

The variable gain mixer circuit 120 multiplies the RFin signal on line 115 with the LO signal on line 175. Alternately, the mixer circuit may be an image reject mixer. The mixer circuit outputs a signal on line IF1 125, which has spectral components at the two frequencies which are the sum and difference of the RFin and LO signals. LPF 130 rejects the sum products of IF1 while passing the low frequency difference components. The bandwidth limitations of the mixer circuit also acts as a low pass filter and helps filter the sum products. A/D 150 digitizes the waveform at filter output IF2 135, and provides a bit stream on bus Dout 155 to the DSP 160. The DSP 160 decodes the data, and provides an output on line 165. The control voltage Vtune from the PLL to the VCO on line 175 controls the oscillation frequency. The PLL compares the LO signal on line 175 to the REF signal provided on line 199, and adjusts the LO frequency. Typically the REF signal frequency is much lower than the VCO frequency. The VCO frequency is divided down in the frequency synthesizer before the phase or frequency comparison is made.

Using this architecture, the VGA 140 and D/A 190 of the receiver channel 100 of FIG. 1 are eliminated. Rather, the conversion gain of the variable gain mixer circuit 120 is adjusted under the control of a digital controller such as a DSP 160, for example. For the embodiment shown in FIG. 3, gain control of the variable gain mixer circuit is illustrated by including a DSP 160 that provides a second output on bus Dgain 195. This signal may be the result of a comparison of the amplitude of A/D output signal Dout on bus 155 with the range of available outputs from the A/D. It is to be understood that digital controllers other than a DSP could be used for providing digital control signals for controlling the gain of the variable gain mixer circuit 120. In one embodiment, the digital controller comprises digital logic that may be used for receiving digital signals on a control input. In response to the digital signals, the logic generates digital control signals for varying the gain of the variable gain mixer circuit 120. Moreover, the gain of the mixer may be adjusted in accordance with other system factors in addition to range control of the A/D.

In contrast to the FIG. 1 system, the digital control signals on Dgain bus 195 of the embodiment of FIG. 3 is not converted to an analog signal for controlling a VGA. Rather, in one embodiment, the digital control signals can be input directly to the variable gain mixer circuit 120 for varying the gain of the signal. For example, an A/D used by one embodiment of the present invention may have 256 available output levels. If the signal at Dout 155 covers a range of only 30 levels, there is excessive quantization error. The conversion gain of mixer circuit 120 can be increased such that the signal amplitude at IF1 125 and IF2 135 are increased. For example, the amplitude may be increased such that 200 levels are used. This increase in mixer gain results in a 4 times increase in the accuracy of the digitization of the waveform on IF2 135. But if all 256 available output levels are used, the signal begins to clip, and information is lost. The gain of mixer circuit 120 can be reduced, again to where 200 levels are used.

The use of a variable gain mixer circuit in a receiver channel, according to one embodiment of the present invention, therefore eliminates the need for a VGA and a D/A converter typically found in conventional receiver channels. Since these blocks are removed, their noise contributions are eliminated. Accordingly, the power consumption and die area are also reduced.

Figure 4:
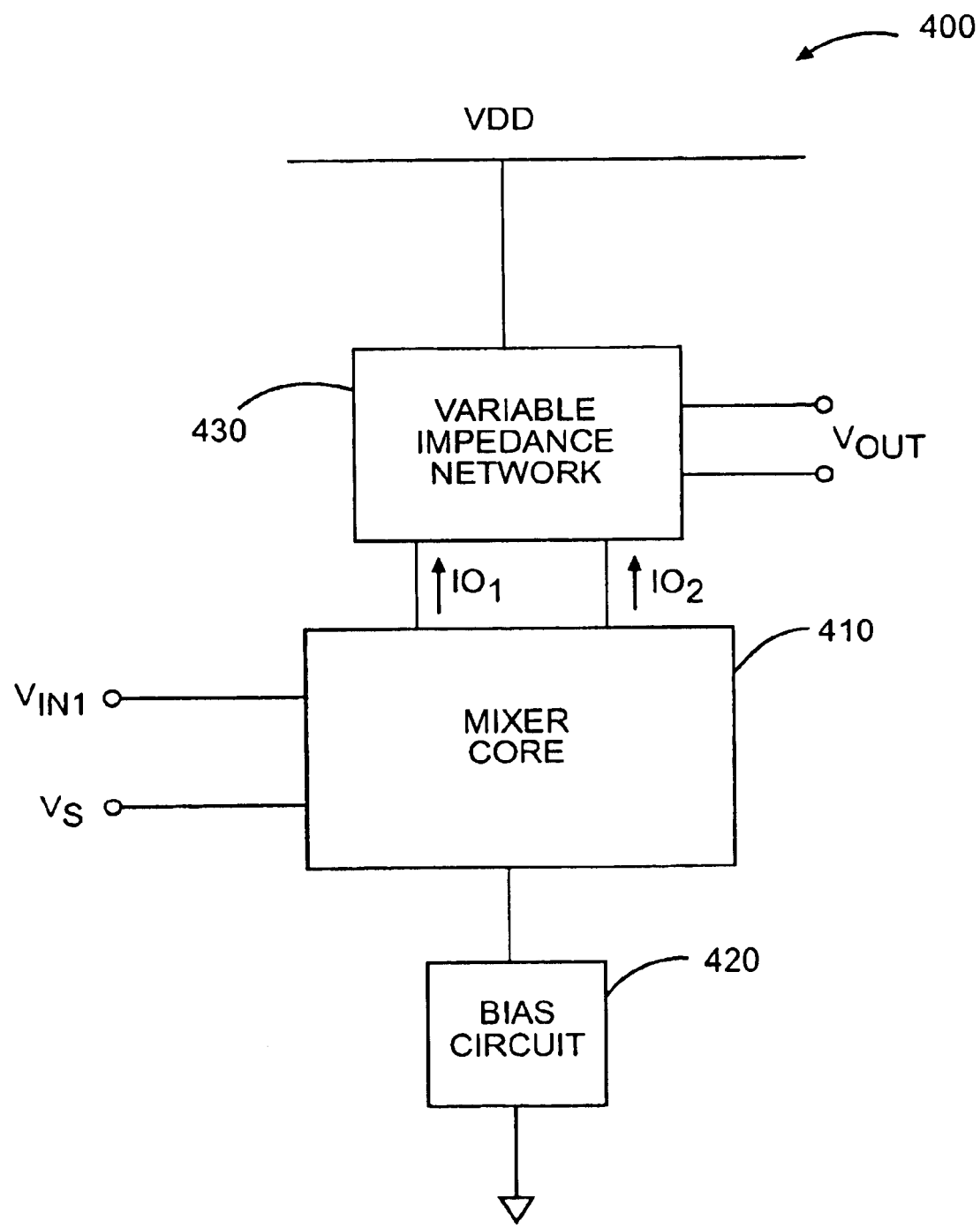
FIG. 4 illustrates a mixer circuit with a variable conversion gain according to one embodiment of the present invention.

FIG. 4 illustrates a mixer circuit 400 with a variable conversion gain according to one embodiment of the present invention. Mixer circuit 400 includes a mixer core 410, a bias circuit 420, and a variable impedance network 430. Mixer core receives first and second input signals Vin1 and Vs, and generates output currents Io1 and Io2. Bias circuit 420 generates a bias current that is coupled to the mixer core 410 for biasing internal circuitry. Output currents Io1 and Io2 are provided to the input of a variable impedance network. The variable impedance network includes a pair of voltage output nodes for providing a differential output voltage Vout. Variable conversion gain may be achieved by selectively coupling the output currents to the voltage output nodes through a variable impedance. The variable impedance may be a digitally controlled resistor network with the output currents selectively coupled to various internal network nodes to produce the desired output voltage as described in more detail below, for example.

It is to be understood that various implementations for mixer core 410 may be used. For example, in one embodiment, the first input signal Vin1 is a differential input signal applied to the input of a differential pair, and the second signal Vs is capacitively coupled to a common node of the differential pair to modulate the bias current in the differential pair. In another embodiment, the second signal Vs is included as a component of the DC bias voltage provided for generating the DC bias current. In yet another embodiment, multiple differential pairs are used to receive the input signal Vin1, and an additional differential pair receives input signal Vs and steers the bias current.

Figure 5:
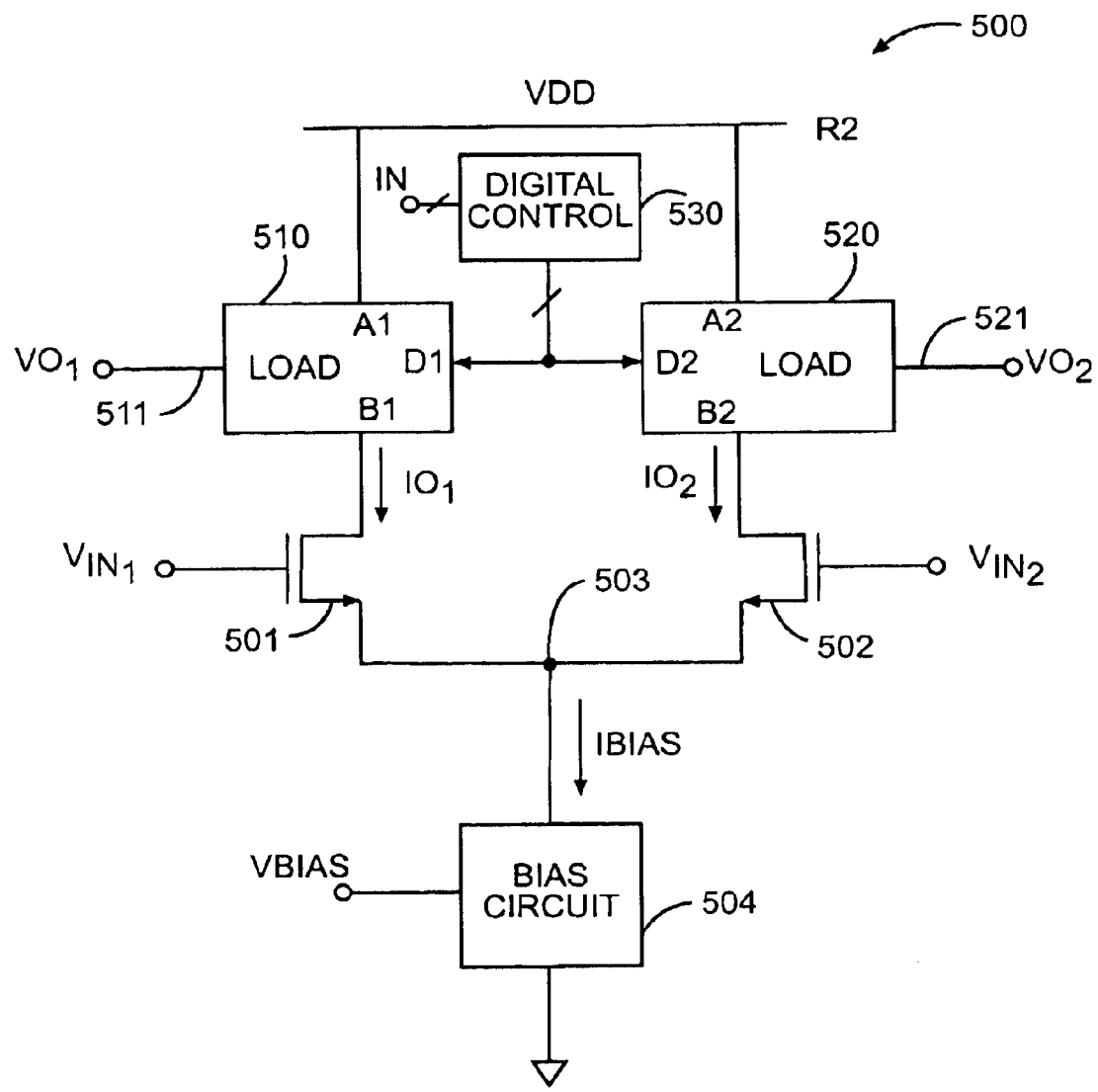
FIG. 5 illustrates a mixer circuit with a variable conversion gain including a differential input stage according to one embodiment of the present invention.

FIG. 5 illustrates a mixer circuit 500 with a variable conversion gain according to one embodiment of the present invention. Mixer circuit 500 includes a differential input stage comprised of source coupled NMOS transistors 501 and 502. It is to be understood that other transistors, such as PMOS, NPN, PNP, or galium arsenide, could also be used in light of the teachings of this description coupled with modifications known by those skilled in the art. A bias circuit 504 receives a bias voltage Vbias and generates a bias current Ibias at the bias circuit output that is coupled to a common node 503 of the differential input stage. Bias circuit 504 may also receive an input signal for modulating the bias current Ibias. For the embodiment of mixer circuit 500 of FIG. 5, the bias circuit input signal Vbias is a signal having both AC and DC components for generating the DC bias current and for modulating the bias current. However, in other embodiments, the bias input signal may include two separate signals on independent signal line for supplying the DC and AC portions of the bias current.

The differential input stage of mixer circuit 500 receives differential input signals Vin1 and Vin2 on the control inputs of transistors 501 and 502 and the modulated bias current Ibias at common node 503. In response to these inputs, differential input stage generates output currents. The output currents of mixer circuit 500 are differential output currents Io1 and Io2. The differential output currents are coupled to the inputs of a variable impedance network for controlling the gain of the mixer circuit. The variable impedance network is coupled between the differential input stage and a supply voltage Vdd and includes a pair of voltage output nodes Vo1 and Vo2 for providing a variable gain mixer output.

For the embodiment of mixer circuit 500, the variable impedance network includes a first variable impedance network 510 having a first current input node (i.e. at terminal B1) coupled to the first differential output current Io1. Additionally, a second variable impedance network 520 having a second current input node (i.e. at terminal B2) is coupled to the second differential output current Io2. Both variable impedance networks 510 and 520 include digital inputs (i.e. D1 and D2) that are coupled to a digital controller 530 for receiving a digital control signal. Digital controller 530 receives digital signals on control input "IN" and produces corresponding digital control signals as inputs to the variable impedance networks 510 and 520. In one embodiment, the digital controller includes integrated digital logic for generating the digital control signals in response to the digital signals at the control input. In response to a digital control signal from digital controller 530, variable impedance networks 510 and 520 selectively couple each of the corresponding differential output currents to a plurality of network nodes inside each variable impedance network. Each network node in the variable impedance network has a unique impedance to the voltage output nodes. Therefore, for a given differential output current, the voltage on the voltage output node may be varied by selectively coupling each of the differential output currents to different network nodes in the variable impedance network. Accordingly, the gain of the mixer circuit may be advantageously controlled by changing the digital control signal, thereby selectively coupling the differential output current to a plurality of different network nodes in each variable impedance network to produce a corresponding plurality of output voltages on each voltage output node.

Figure 6:
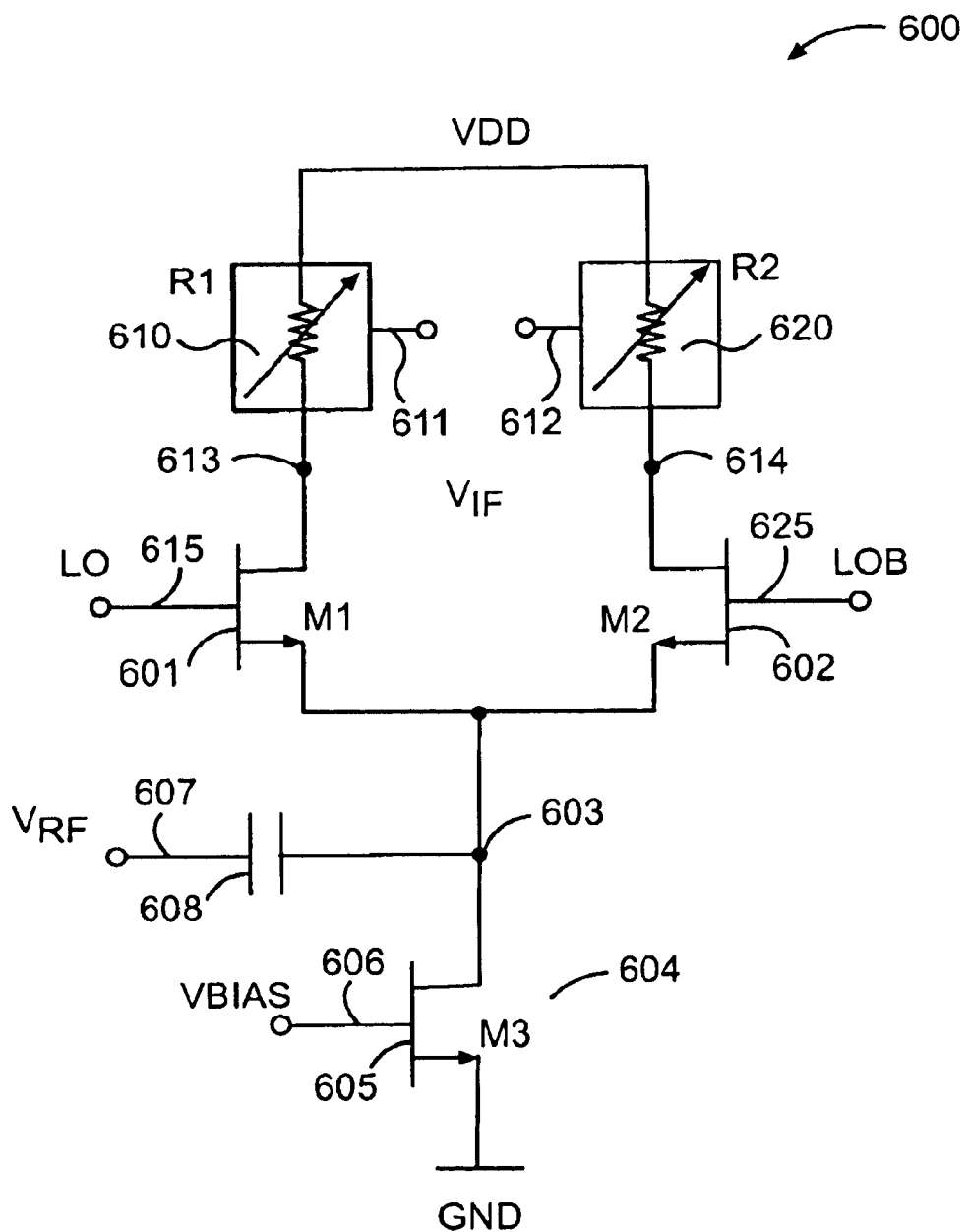
FIG. 6 illustrates a mixer circuit with a variable conversion gain useful for demodulating high frequency signals according to another embodiment of the present invention.

FIG. 6 illustrates a mixer circuit 600 with a variable conversion gain useful for demodulating high frequency signals according to another embodiment of the present invention. Mixer circuit 600 includes a differential input stage including NMOS transistors M1 601 and M2 602, a bias circuit 604, and a variable impedance network illustrated by variable resistors 610 and 620. The differential input stage receives a differential input signal LO and $\overline{LO}$ from the differential output of a local oscillator on differential input nodes 615 and 625. The differential input stage also receives a bias current from bias circuit 604, which is comprised of a NMOS transistor 605. The bias circuit 604 receives a bias voltage Vbias on voltage bias node 606. NMOS transistor 605 generates a current Ibias between a source coupled to ground and a drain coupled to common node 603 of the differential input stage.

A high frequency RF input signal $V_{RF}$ that includes a carrier and a data sideband is introduced into the differential input stage mixer core at node 607. $V_{RF}$ is capacitively coupled to common node 603 through capacitor 608 to modulate the bias current Ibias. The modulated bias current is then provided to the differential input stage, and first and second differential output currents are generated that include the sum and difference frequency components of the differential input signal LO/$\overline{LO}$ and the high frequency input signal $V_{RF}$.

The first and second differential output currents are coupled to a variable impedance network that is shown figuratively by a pair of variable resistors 610 and 620 to illustrate the advantages of the present embodiment. Variable resistors 610 and 620 are coupled between the drain nodes of transistors M1 and M2 and the supply voltage Vdd. The differential output currents are coupled to the current input nodes 613 and 614 of the variable impedance networks 610 and 620. Each of the variable impedance networks 610 and 620 also includes voltage output nodes 611 and 612 for providing a variable gain mixer output signal. In the present embodiment, the output signal includes an intermediate frequency signal VIF corresponding to the demodulation of the RF input signal VRF. Variable impedance networks 610 and 620 selectively couple each of the corresponding differential output currents to a plurality of network nodes inside each variable impedance network. Each network node in the variable impedance network has a unique impedance to the corresponding voltage output nodes 611 and 612. Moreover, each network node may also have a unique impedance between the current input nodes 613 and 614 and the supply voltage Vdd. For example, a first network node may have a first resistance to the voltage output node 611 and a second resistance to the supply voltage Vdd. Therefore, coupling one of the differential output currents to the network node will produce a first corresponding voltage on the voltage output node 611. Additionally, a second network node may have a third resistance to the voltage output node 611 and a fourth resistance to the supply voltage Vdd. Accordingly, coupling the same one of the differential output currents to the second network node will produce a second corresponding voltage on the voltage output node 611. Therefore, for a given differential output current, the voltage on the voltage output node may be varied by selectively coupling each of the differential output currents to different network nodes in the variable impedance network. Accordingly, the gain of the mixer circuit may be advantageously controlled by selectively coupling the differential output currents to a plurality of different network nodes in each variable impedance network to produce a corresponding plurality of output voltages on each voltage output node.

Figure 7:
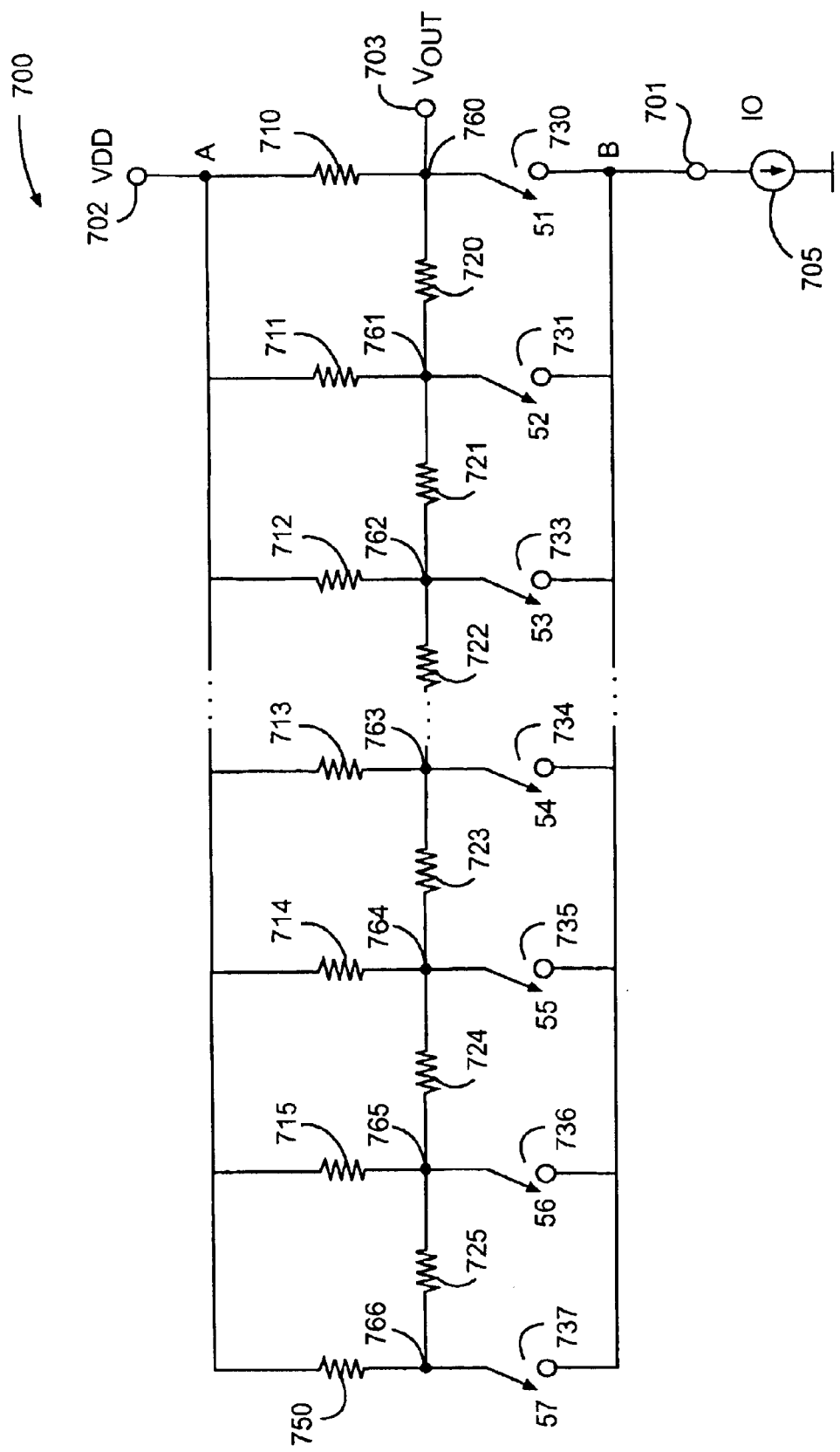
FIG. 7 illustrates a variable impedance network that may be utilized in a variable gain mixer circuit according to one embodiment of the present invention.

To further understand features and advantages of the present invention, FIG. 7 illustrates a variable impedance network 700 that may be utilized in a variable gain mixer circuit according to one embodiment of the present invention. The variable impedance network 700 has the advantage of providing for a linear gain variation across a range of values which is particularly useful in receiver networks. A linear current-to-voltage transfer characteristic is achieved by providing a variable impedance network 700 that includes a plurality of first resistors 710–715 coupled between a plurality of network nodes 760–765 and a supply voltage node 702. Additionally, a plurality of second resistors 720–725 are coupled between all adjacent network nodes 760–766. Moreover, a terminal resistor 750 is coupled between the last network node 766 and the supply voltage node 702. The variable impedance network output is taken from voltage output node 703.

To vary the gain of a mixer circuit in accordance with one embodiment of the invention, an output current from a mixer core, discussed above, is coupled to the input of a variable impedance network. For the variable impedance network 700 of FIG. 7, a mixer core output current 705 may coupled to a current input node 701 of the variable impedance network 700. The variable impedance network 700 may also receive a digital input (not shown) for selectively coupling the current input node 701 through one of a plurality of switches 730–737 to one of the plurality of network nodes 760–766. Therefore, the impedance between the current input node 701 and the voltage output node 703, and additionally, the impedance between the current input node 701 and the supply voltage node Vdd 702, can be varied by selectively coupling the current input node 701 to different network nodes in the variable impedance network.

In one embodiment of variable impedance network 700, the plurality of first resistors 710–715 have double the resistance value of the plurality of second resistors 720–725 and the terminal resistor 750. Such a configuration of resistors with the above mentioned resistance value relationship is herein referred to as an R2R ladder resistor network. Utilizing an R2R ladder resistor network, in conjunction with selectively coupling a mixer core output current through a plurality of switching elements to achieve a variable impedance network between the mixer core output and the voltage output node of the mixer circuit, allows a designer to obtain a mixer circuit with a linear variable gain.

For example, when variable impedance network 700 receives a digital control signal on the digital input line (not shown) for closing switch S1 730, the current input node is coupled directly to the voltage output node 703. Accordingly, the voltage at the output is given by:

$$V_{out} = Vdd - R \times I$$

where R is the value of the series resistors 720–725 and terminal resistor 750. The above relation is more easily understood by pointing out that terminal resistor 750, having a value of R, and series resistor 725, also having a value of R, are connected in parallel with shunt resistor 715, which has a value of 2R. Therefore, the input impedance looking into node 765 is 2R in parallel with 2R, which is equal to R. It can be seen that this result ripples down to network node 760, resulting in an output impedance of R.

However, when the variable impedance network 700 receives a digital control signal for closing switch S2 731, the current input node is coupled to the voltage output node 703 through network node 761. Accordingly, the voltage at the output is given by:

$$V_{out} = Vdd - (R \times I)/2$$

where R is again the value of the series resistors 720–725 and terminal resistor 750. In this case, the impedance between the current input node 701 and both the voltage output node 703 and supply voltage node 702 has changed. Therefore, less current flows through shunt resistor 710, and the voltage output node is at a higher voltage for a given mixer core output current 705. In fact, for the R2R ladder resistor network, the voltage output node increases in a binary relation as the variable impedance network selectively couples the current input node to successive network nodes. Table 1 below illustrates the relation between a mixer core output current and the output voltage of the mixer circuit for ten different digital control signals that selectively couple the current input node 701 to ten different network nodes through ten different switches according to one embodiment of the present invention. It is to be understood however, as illustrated in FIG. 7, that different numbers of network nodes and corresponding numbers of switches and resistors may also be used.

TABLE 1

| Switch | Current-to-voltage |
|---|---|
| S1 | $V_{out} = Vdd - R \times I$ |
| S2 | $V_{out} = Vdd - (R \times I)/2$ |
| S3 | $V_{out} = Vdd - (R \times I)/4$ |
| S4 | $V_{out} = Vdd - (R \times I)/8$ |
| S5 | $V_{out} = Vdd - (R \times I)/16$ |
| S6 | $V_{out} = Vdd - (R \times I)/32$ |
| S7 | $V_{out} = Vdd - (R \times I)/64$ |
| S8 | $V_{out} = Vdd - (R \times I)/128$ |
| S9 | $V_{out} = Vdd - (R \times I)/256$ |
| S10 | $V_{out} = Vdd - (R \times I)/512$ |

Table 1 illustrates that the output voltage of a mixer circuit that includes a variable impedance network similar to that shown in FIG. 7, will vary according to a binary relation as the current input node is selectively coupled to different network nodes. Therefore, the variation is linear in decibels ("dB"). This can be seen by recognizing that the change in output voltage across each successive network node (i.e. across successive switches) is given by:

$$\Delta Vo(dB) = 20 \log_{10}(2) = 6.02 \ dB$$

Therefore, by coupling mixer core output current on current input nodes 701 to successive network nodes 760–766 in an R2R ladder resistor network, a varying impedance between the current input node and voltage output node will generate a mixer circuit output with a variable gain that is substantially linear in dB.

Figure 8:
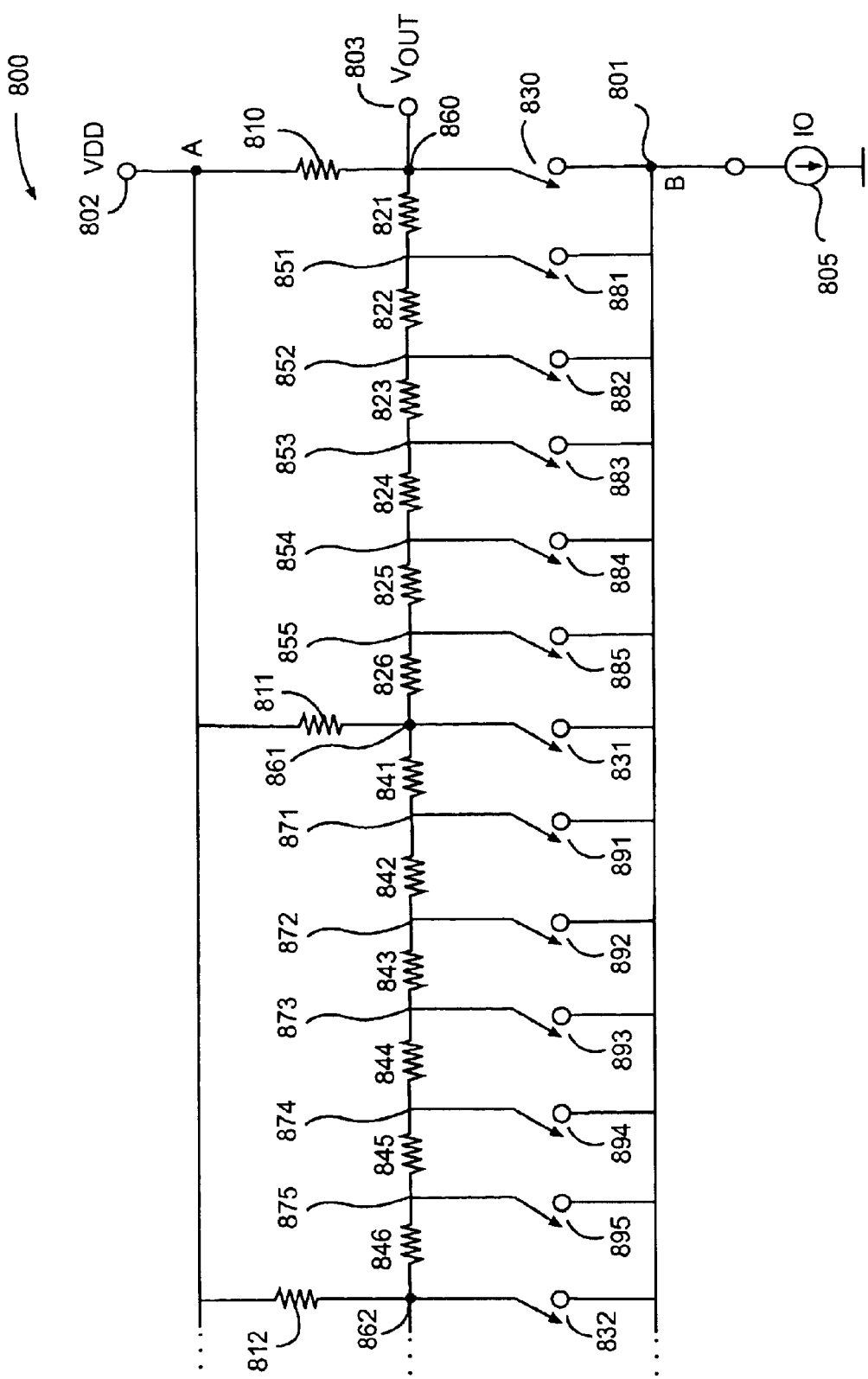
FIG. 8 illustrates another embodiment of the present invention for obtaining a variable gain mixer circuit with finer step resolution.

FIG. 8 illustrates another embodiment of the present invention for obtaining a variable gain mixer circuit with finer step resolution. FIG. 8 shows a portion of a variable impedance network 800. For the embodiment of FIG. 8, the series resistors between adjacent nodes in FIG. 7 (e.g. resistors 720 and 721) have each been divided into a plurality of resistor segments (e.g. segments 821–826 and segments 841–846) in FIG. 8. In one embodiment, the resistor segments are of equal value, namely R/6. Between each resistor segment are corresponding intermittent nodes (e.g. nodes 851–855 and nodes 871–875). Each intermittent node is selectively coupled to the current input node 801 for coupling a mixer core output current to the voltage output node 803 across a variable impedance that is dependent upon the particular switch selected by the digital control signal (not shown).

Figure 9:
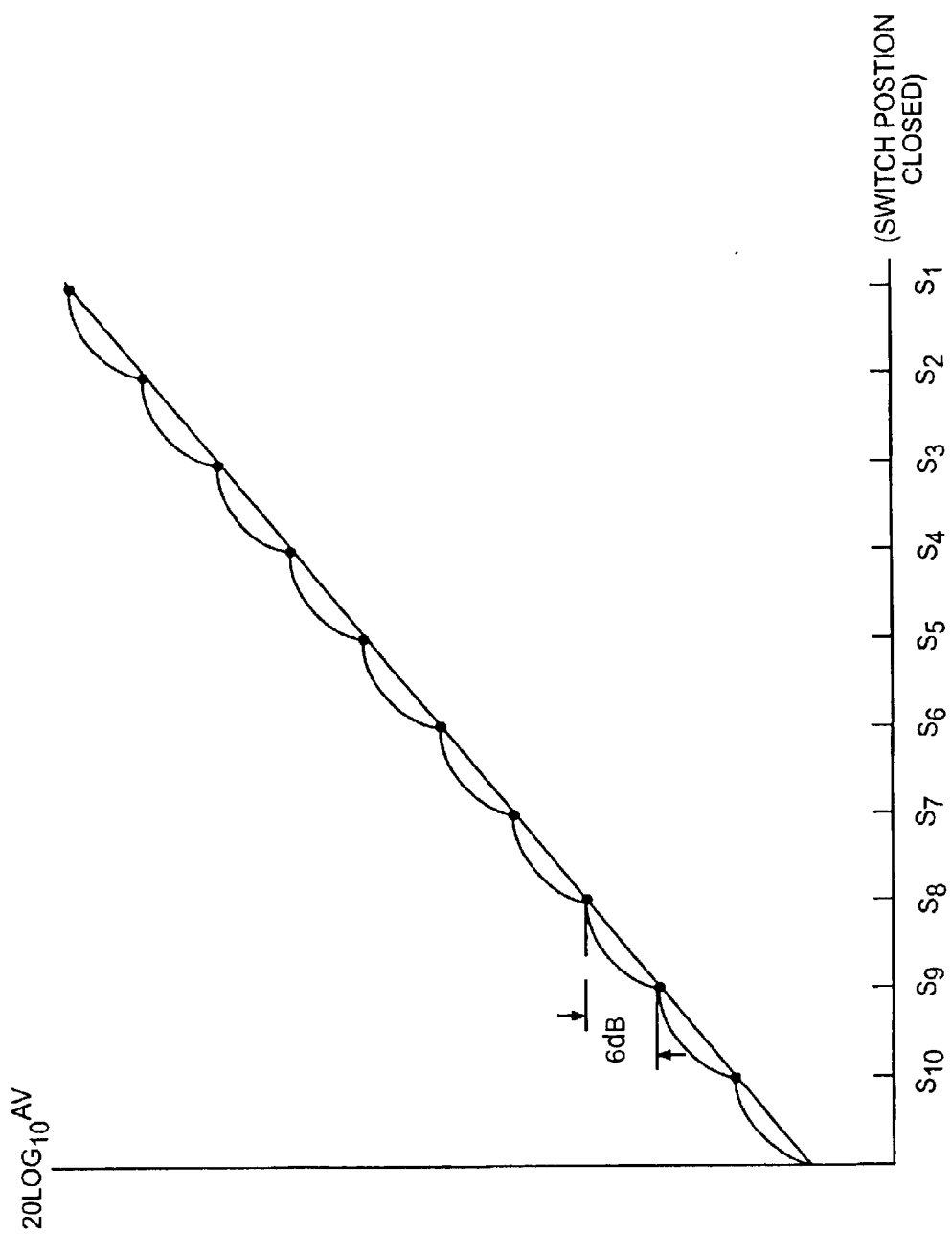
FIG. 9 shows a plot of the variation of a mixer circuit output having a variable impedance network according to one embodiment of the present invention.

FIG. 9 shows a plot of the variation of a mixer circuit output having a variable impedance network with ten switches according to one embodiment of the present invention. FIG. 9 illustrates that the gain variation of the mixer circuit is substantially linear in dB across 6dB steps. However, when the fine resolution switches of FIG. 8 (e.g. switches 881–885 or switches 891–895) are individually coupled to the current input node, the gain variation becomes non-linear because the resistor segments are of equal value and the behavior of the variable impedance network deviates from an R2R ladder resistor network. FIG. 9 also illustrates that the impedance network is monotonic, which is also advantageous in receiver channels systems.

Figure 10:
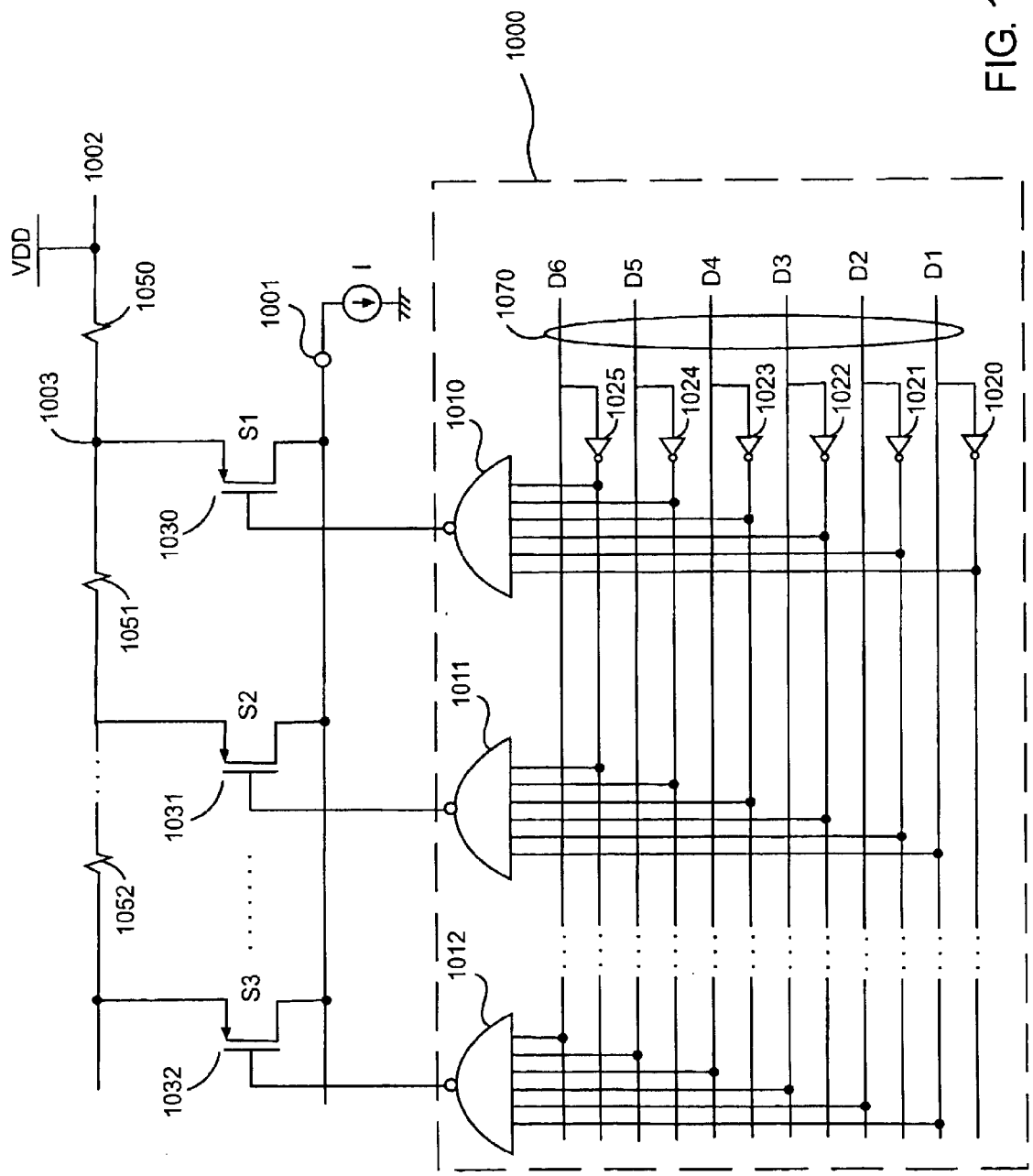
FIG. 10 illustrates a digital controller for receiving a control input and producing a digital control signal according to one embodiment of the present invention.

FIG. 10 illustrates a digital controller 1000 for receiving a control input and producing a digital control signal according to one embodiment of the present invention. Digital controller 1000 illustrates the decoding for selection of one of the plurality of switches disposed in a variable impedance network. Digital controller 1000 receives digital signals $D_1-D_6$ on control input lines 1070 and is capable of selecting one of up to 64 switches. Only three switches S1–S3 and the corresponding 6-input NAND gates 1010–1012 are shown. However, additional logic and switches may be included as needed as would be understood by those skilled in the art. Each NAND gate of digital controller 1000 receives an input including each of the input signals $D_1$–D6 as either a true signal or a complement. Six inverters 1020–1025 each generate an inverse of a different one of the input signals $D_1$–$D_6$ for coupling either an input signal or the complement of the input signal to each of the six inputs of the NAND gates.

In one embodiment, the switches are implemented using PMOS transistors. The output signal of each NAND gate 1010–1012 is applied to the gate terminal of a corresponding one of PMOS transistor switches 1030–1032. At any given time, the output signal of only one of the NAND gates 1010–1012 is at a low level thereby causing only one of the PMOS transistor switches 1030–1032 to be on. It is to be understood however that other techniques for implementing the switches in a variable impedance network could be used. For example, complementary transmission gates or NMOS devices with corresponding changes to the logic implemented in the digital controller could be used. Additionally, other architectures or logic arrangements for the digital controller could be used for receiving a desired number of digital signals and generating digital control signals for activating one of the switches in the variable impedance network and thereby varying the gain of the mixer circuit.

The exemplary embodiments of the present invention are illustrative and not limitative. It is to be understood that although the receiver architecture described in the above detailed description was directed to a direct conversion or homodyne structure, a variable gain mixer circuit is also advantageous in other receiver architectures employing multiple intermediate frequencies between the input RF frequency and the baseband. Additionally, the present invention is not limited by the type of mixer core that is used in conjunction with a variable impedance network. The invention is also not limited by the number of series resistors or shunt resistors in the variable impedance network according to other embodiments of the invention. Nor is the invention limited by the number of resistor segments that are connected in series between adjacent network nodes of a variable impedance network. Moreover, the inventions is also not limited by the type of digital controller that generates the digital control signals for the variable impedance network. Also, the resistors in the resistor network may be implemented in an integrated circuit using one or more available resistive materials such as polysilicon or an n-type or p-type diffusion well as is well known in the art. Additionally, the present invention may employ a various numbers of network nodes in the variable impedance network along with corresponding numbers switches. Accordingly, equivalents and alternatives along with the understood obvious changes and modifications are intended to be included within the scope of the present invention as defined by the following claims.

What is claimed is:

1. An apparatus including a receiver system, the receiver system comprising:
    a first amplifier having an input coupled to receive an input RF signal and an output to produce an amplified RF signal;
    a variable gain mixer circuit comprising:
        a mixer core having a first input, a second input receiving the amplified RF signal, and a plurality of output currents;
        a bias circuit coupled to the mixer core for providing a bias current; and
        a variable impedance network coupled to the plurality of output currents and having a variable impedance based on a digital control signal provided to a control input of the variable gain mixer, wherein each of the plurality of output currents is selectively coupled to a corresponding voltage output node through the variable impedance network;
    a low pass filter coupled to the mixer output;
    an analog-to-digital converter coupled to the low pass filter, the analog to digital converter producing a digital output signal; and
    a voltage controlled oscillator for producing an oscillator signal, the oscillator signal coupled to the first input of the variable gain mixer circuit;
    wherein the variable gain mixer circuit receives the digital control signal at the control input for varying the gain of the mixer circuit.

2. The receiver system of claim 1 wherein the digital output signal of the analog-to-digital converter is coupled to the variable gain mixer circuit for producing the digital control signal.

3. The receiver system of claim 1 further comprising a phase locked loop coupled to the voltage controlled oscillator.

4. The receiver system of claim 1 further comprising a digital controller coupled to receive the digital output signal of the analog-to-digital converter, the digital controller generating digital control signals to vary the gain of the variable gain mixer circuit.

5. The receiver system of claim 4 wherein the digital controller is a digital signal processor.

6. The receiver system of claim 4 wherein the digital controller includes digital logic for receiving a first digital signal and generating a digital control signal for activating one of a plurality of switches to vary the gain of the mixer circuit.

7. The receiver system of claim 1 wherein the variable gain mixer circuit has a substantially linear gain variation.

8. The receiver system of claim 1 wherein the variable gain mixer circuit has a monotonic gain variation.

9. The receiver system of claim 1 wherein the mixer core comprises a differential input stage.

10. The mixer circuit of claim 1 wherein the bias circuit comprises a MOS transistor.

11. The mixer circuit of claim 1 wherein the variable impedance network comprises an R2R ladder resistor network.

12. The mixer circuit of claim 11 wherein the R2R ladder resistor includes a plurality of network nodes, and wherein each of the plurality of output currents is coupled to the plurality of network nodes through a plurality of digitally controlled switches.

13. The mixer circuit of claim 12 wherein each of the plurality of digitally controlled switches is comprised of a MOS transistor.

14. An apparatus including a receiver system, the receiver system comprising:
    a first amplifier having an input coupled to receive an input RF signal and an output to produce an amplified differential RF signal;
    a variable gain mixer circuit comprising:
        a differential input stage for receiving the amplified differential RF signal and generating first and second differential output currents;
        a bias circuit having a bias output coupled to the differential input stage, the bias circuit receiving a bias signal, and in accordance therewith, generating a bias current at the bias output; and first and second variable impedance networks having corresponding first and second current input nodes, the first current input node coupled to the first differential output current and the second current input node coupled to the second differential output current, each variable impedance network including a digital input for receiving a digital control signal and a voltage output node;

wherein each current input node is selectively coupled to a plurality of network nodes in the corresponding variable impedance network in accordance with the digital control signal, and each network node having a unique impedance to the corresponding voltage output node;

a low pass filter coupled to each of the voltage output nodes of the variable gain mixer;

an analog-to-digital converter coupled to the low pass filter, the analog to digital converter producing a digital output signal; and a voltage controlled oscillator for producing an oscillator signal, the oscillator signal coupled to the first input of the variable gain mixer circuit;

wherein each of the variable impedance networks receives the digital control signal at the digital input for varying the gain of the variable gain mixer circuit.

15. The receiver system of claim 14 further comprising a digital controller for receiving a control input and producing the digital control signal.

16. The receiver system of claim 14 wherein the differential input stage comprises first and second source coupled MOS transistors.

17. The receiver system of claim 14 wherein the bias signal comprises a DC bias voltage.

18. The receiver system of claim 14 wherein the bias signal includes an AC bias signal, the bias circuit generating a bias current having an AC component, and in accordance therewith, modulating the differential output current.

19. The receiver system of claim 14 wherein the bias circuit includes an NMOS transistor.

20. The receiver system of claim 14 wherein each variable impedance network comprises:

a plurality of first resistors coupled between each of the plurality of network nodes and a supply voltage;

a plurality of second resistors coupled between adjacent network nodes in the plurality of network nodes; and a plurality of switches coupled to receive the digital control signal, and in accordance therewith, selectively coupling the current input node to one of the plurality network nodes.

21. The receiver system of claim 20 wherein the plurality of first resistors and the plurality of second resistors comprise an R2R resistor network.

22. The receiver system of claim 20 wherein each of the plurality of second resistors comprise a plurality of resistor segments coupled in series between adjacent network nodes, the plurality of resistor segments having a corresponding plurality of intermittent nodes, wherein the plurality of intermittent nodes are coupled to the current input node by a corresponding plurality of segment switches.

23. An apparatus including a receiver system, the receiver system comprising:

A) a first amplifier having an input coupled to receive in input RF signal and an output to produce an amplified differential RF signal;

B) a variable gain mixer circuit comprising:
i) first and second transistors for receiving the amplified differential RF signal;
ii) a third transistor for receiving a modulated RF signal and for setting the DC bias current in the mixer; and
iii) a variable impedance network having a first terminal coupled to the first supply voltage and a second terminal coupled to a first current output of at least one of the first and second transistors, the variable impedance network further comprising:
a) a plurality of network nodes;
b) a plurality of series resistors coupled between each of the network nodes each having a resistance R;
c) a plurality of shunt resistors coupled between the network nodes and the supply voltage each having a resistance of 2R;
d) a terminal shunt resistor coupled between a terminal network node and the supply voltage; and
e) a plurality of switches for coupling the first current output to at least one of the network nodes based on a digital control signal;

C) a low pass filter coupled to one of the plurality of network nodes in the variable impedance network of the variable gain mixer;

D) an analog-to-digital converter coupled to the low pass filter, the analog to digital converter producing a digital output signal; and E) a voltage controlled oscillator for producing an oscillator signal, the oscillator signal coupled to the first input of the variable gain mixer circuit;

wherein the variable gain mixer circuit receives the digital control signal for varying the gain of the variable gain mixer circuit.

24. The receiver system of claim 23 further comprising a digital controller coupled to the variable impedance network, the digital controller coupling the digital control signal to the variable impedance network for controlling the plurality of switches in response to receiving a control input.

25. The receiver system of claim 24 wherein the digital controller farther comprises a plurality of NAND gates.

26. The receiver system of claim 23 wherein each of the plurality of series resistors further comprises N series resistor segments, the N series resistor segments having intermittent nodes, and wherein each intermittent node is coupled to the first current output by a corresponding segment switch.

27. The receiver system of claim 26 wherein the N series resistor segments each have a resistance of R/N.

28. The receiver system of claim 26 wherein each of the plurality of switches and each segment switch farther comprises a MOS transistor.

* * * * *